United States Patent
Lajux et al.

(10) Patent No.: US 10,687,430 B2
(45) Date of Patent: Jun. 16, 2020

(54) ELECTRICAL COMPONENT SUPPORT BRACKET

(71) Applicant: Rockwell Collins, Inc., Cedar Rapids, IA (US)

(72) Inventors: Vincent M. O. Lajux, Milton Keynes (GB); Lucy E. Anderson, Kempston (GB)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/186,194

(22) Filed: Nov. 9, 2018

(65) Prior Publication Data
US 2020/0154582 A1 May 14, 2020

(51) Int. Cl.
| H02G 3/12 | (2006.01) |
| H05K 5/02 | (2006.01) |
| F16B 2/22 | (2006.01) |
| F16B 2/06 | (2006.01) |
| B60R 11/00 | (2006.01) |

(52) U.S. Cl.
CPC .......... *H05K 5/0204* (2013.01); *F16B 2/065* (2013.01); *F16B 2/22* (2013.01); *H02G 3/12* (2013.01); *H02G 3/125* (2013.01); *B60R 11/00* (2013.01)

(58) Field of Classification Search
CPC .... F16B 2/065; F16B 2/22; F16B 2/20; B60R 11/00; E02G 3/125; E04B 9/06; H02G 3/12; H02G 3/125; H05K 5/0204
USPC ..................... 248/316.6, 27.1, 27.3
See application file for complete search history.

(56) References Cited

U.S. PATENT DOCUMENTS

| 2,712,917 | A | 7/1955 | Flora et al. |
| 5,472,355 | A | 12/1995 | Wittmann |
| 6,741,452 | B1* | 5/2004 | Liu .......................... H01H 9/02 200/295 |
| 9,115,506 | B2* | 8/2015 | Hill ..................... E04H 17/1421 |
| 9,261,120 | B2* | 2/2016 | Colangelo ................. F16B 2/22 |
| 9,444,236 | B2* | 9/2016 | Witherbee ............. H02G 3/126 |

(Continued)

FOREIGN PATENT DOCUMENTS

| EP | 1382494 A1 | 1/2004 |
| EP | 2147827 A1 | 1/2010 |

(Continued)

OTHER PUBLICATIONS

Extended Search Report dated Apr. 8, 2020 for EP Application No. 19208379.8.

*Primary Examiner* — Nkeisha Smith
(74) *Attorney, Agent, or Firm* — Suiter Swantz pc llo

(57) ABSTRACT

An electrical component support bracket is disclosed. In embodiments, the electrical component support bracket includes a base member, a component support surface, and a component support member. The component support surface extends from the base member with an angled transition between the base member and the component support surface. The component support member is configured to surround at least a portion of an electrical component. The component support member includes a first tab and a second tab disposed at opposite ends of the component support member. The first tab and the second tab are configured to be coupled to the component support surface so that the electrical component is held against the component support surface by the component support member.

11 Claims, 13 Drawing Sheets

(56) References Cited

U.S. PATENT DOCUMENTS

| | | |
|---|---|---|
| D787,918 S | 5/2017 | Rago |
| 10,274,109 B2* | 4/2019 | Kozan ................... F16L 3/223 |
| 2010/0288992 A1* | 11/2010 | Gray ................. E04H 17/1421 |
| | | 256/65.03 |
| 2013/0043368 A1* | 2/2013 | Hill .................... E04H 17/1421 |
| | | 248/534 |
| 2015/0285432 A1* | 10/2015 | Johnson .............. F16M 13/022 |
| | | 248/476 |
| 2019/0024693 A1* | 1/2019 | Smith ....................... F16B 2/22 |
| 2019/0296534 A1* | 9/2019 | Kellerman ............... H02G 3/12 |

FOREIGN PATENT DOCUMENTS

| | | |
|---|---|---|
| EP | 2878493 A1 | 6/2015 |
| KR | 1998046696 U | 9/1998 |
| KR | 200409204 Y1 | 2/2006 |
| KR | 20160081059 A | 7/2016 |
| WO | 2014071021 A1 | 5/2014 |
| WO | 2015136448 A1 | 9/2015 |

\* cited by examiner

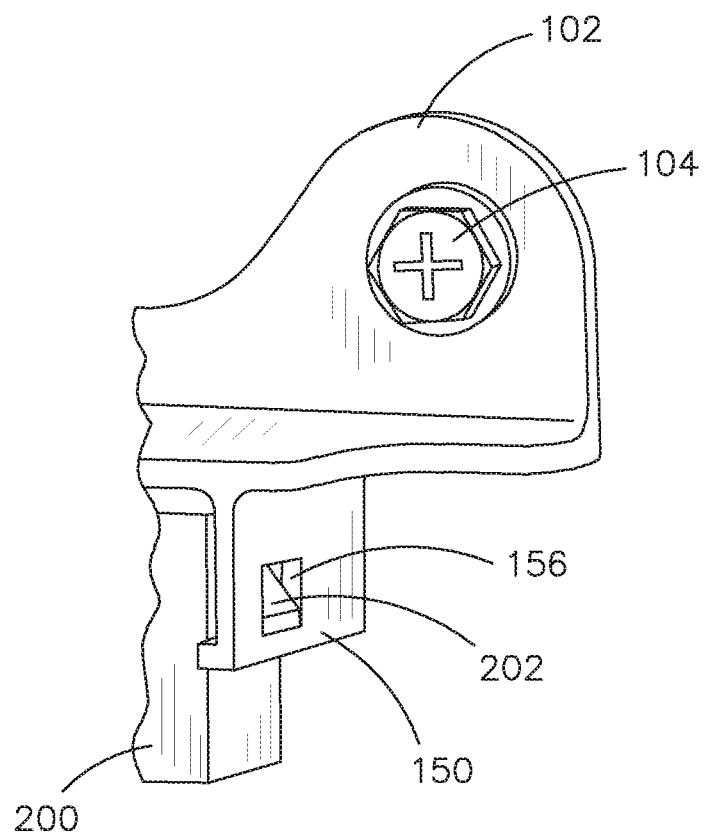
FIG. 11
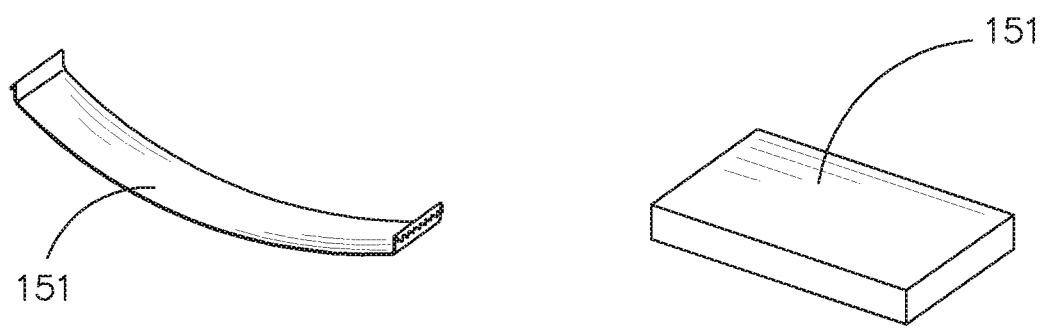
FIG. 12A
FIG. 12B

ELECTRICAL COMPONENT SUPPORT BRACKET

BACKGROUND

Support brackets can be used to mount various electrical components, such as, but not limited to, relays, distribution blocks, switches, and connectors. Efficient utilization of space and resources is of utmost important in aircrafts, other vehicles, and other settings with space constraints. Consequently, there is a need for improved electrical component support brackets.

SUMMARY

In one aspect, embodiments of the inventive concepts disclosed herein are directed to a lightweight support bracket for securing an electrical component (e.g., a relay, distribution block, switch, connector, or the like) in a fixed position where existing attachment points and spacing have to be maintained, but with an emphasis on significant cost reduction by employing a simplified design.

In embodiments, the electrical component support bracket includes a base member, a component support surface, and a component support member. The component support surface extends from the base member with an angled transition between the base member and the component support surface. The component support member is configured to surround at least a portion of an electrical component. The component support member includes a first tab and a second tab disposed at opposite ends of the component support member. The first tab and the second tab are configured to be coupled to the component support surface so that the electrical component is held against the component support surface by the component support member.

In other embodiments, the electrical component support bracket includes a base member and a component support member extending from the base member, with an angled transition between the base member and the component support member. The component support member is configured to surround at least a portion of an electrical component. The component support member includes a first vertical support leg and a second vertical support leg extending from opposite ends of the component support member. The first vertical support leg and the second vertical support leg are configured to hold the electrical component between the first vertical support leg and the second vertical support leg.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 11 is a zoomed in portion of a perspective front view of an electrical component support bracket, in accordance with an example embodiment of this disclosure;

FIG. 12A is a perspective view of a deformable filler for a component support member of an electrical component support bracket, in accordance with an example embodiment of this disclosure;

FIG. 12B is a perspective view of a deformable filler for a component support member of an electrical component support bracket, in accordance with an example embodiment of this disclosure;

DETAILED DESCRIPTION

Figure 1:
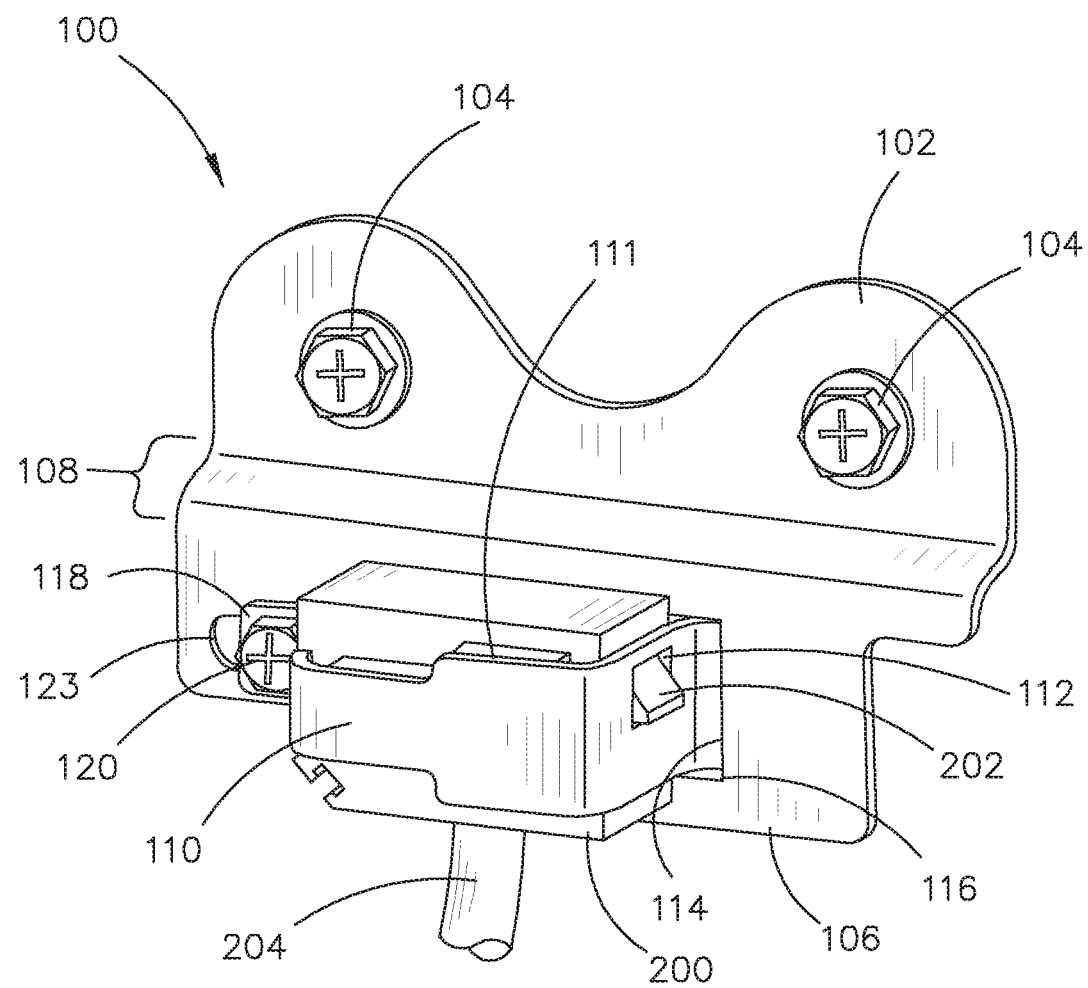
FIG. 1 is a perspective front view of an electrical component support bracket, in accordance with an example embodiment of this disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a lightweight support bracket for securing an electrical component (e.g., a relay, distribution block, switch, connector, or the like) in a fixed position where existing attachment points and spacing have to be maintained, but with an emphasis on significant cost reduction by employing a simplified design. Electrical component support brackets, in accordance with one or more embodiments of this disclosure, can be installed in aircraft environments, for example, in an aircraft galley to secure a connector for an aircraft galley insert (e.g., an appliance) to a surface within the aircraft galley. Electrical component support brackets can also be used in other aircraft environments (e.g., crew cabins, passenger cabins, lavatories, etc.), or in other vehicles (e.g., cars, busses, trains, boats, etc.), or in other settings (e.g., in offices, kitchens, and other building facilities).

Referring generally to FIGS. 1 through 18, various embodiments of an electrical component support bracket 100 are shown and described. In embodiments, the electrical component support bracket 100 may be manufactured out of metallic or non-metallic components, or a combination of both. For example, a base structure of the electrical component support bracket 100 may be manufactured by metallic pressing/stamping. In another example embodiment, the base structure may be manufactured by non-metallic injection molding, thereby eliminating any requirement for electrical grounding for safety purposes. In another example embodiment, the base structure may be manufactured by a combination of metallic and non-metallic parts using one or more of the aforementioned processes.

Figure 2:
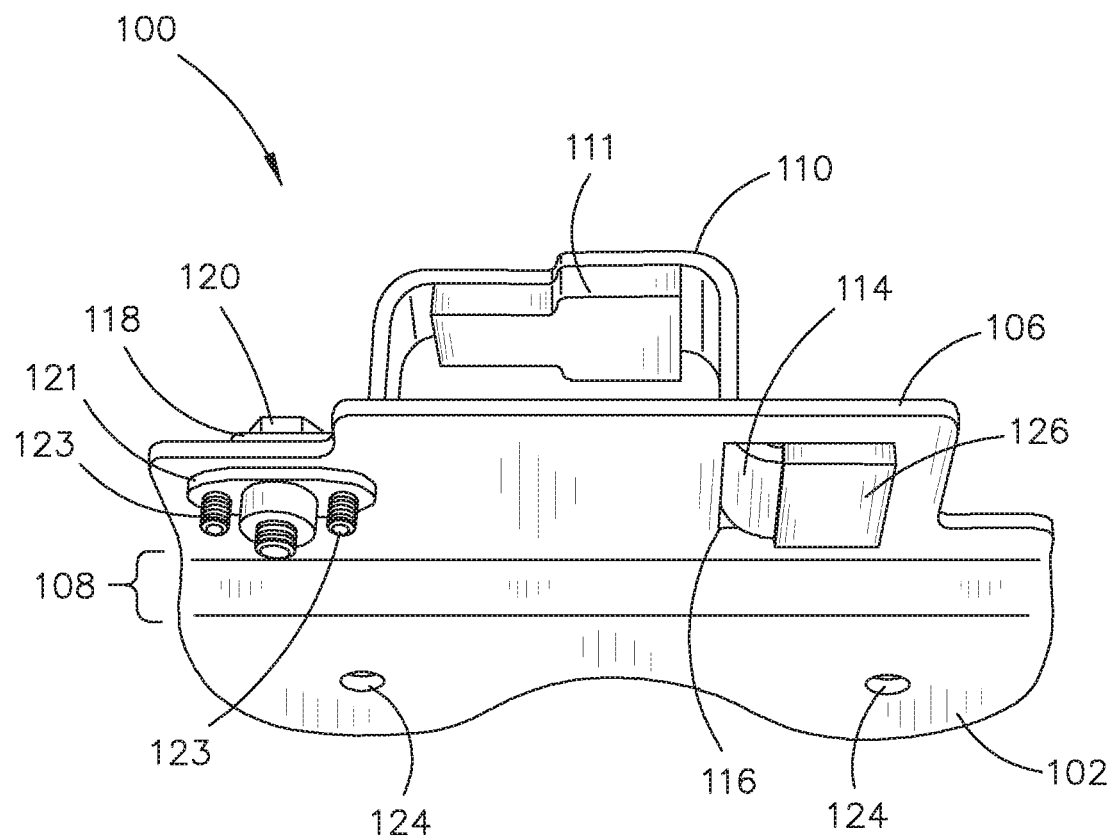
FIG. 2 is a perspective rear view of an electrical component support bracket, in accordance with an example embodiment of this disclosure.

In the embodiments illustrated in FIGS. 1 through 8E, the base structure or backplate of the electrical component support bracket 100 includes a base member 102 and a component support surface 106. As shown in FIGS. 1 and 2, the component support surface 106 may extend from the base member 102 with an angled transition 108 between the base member 102 and the component support surface 106. For example, the base member 102 and the component support surface 106 may be portions of a common structure manufactured by metallic pressing or non-metallic injection molding, or alternatively by metallic/non-metallic casting. The angled transition 108 or step between the base member 102 and the component support surface 106 causes the component support surface 106 to be suspended at a distance from a mounting surface when the base member 102 is secured to the mounting surface (e.g., a surface within an aircraft galley or any other environmental surface on which the electrical component support bracket 100 is installed). In some embodiments, the base member 102 can be secured to the mounting surface by one or more fasteners/fixings 104 (e.g., screws, bolts, or the like) that can be extended through respective holes 124 in the base member 102. In other embodiments, the base member 102 may be secured to the mounting surface by an adhesive, clips, or any other mounting means. As shown in FIG. 1, the base member 102 may include an indentation between a first attachment point and a second attachment point (e.g., fasteners 104/holes 124). Alternatively, as shown in FIGS. 8A through 8E, the base member 102 may comprise a simplified, uniform structure between the attachment points (e.g., fasteners 104/holes 124). This may result in added weight, but the simplified design may reduce manufacturing costs and increase strength of the base member 102.

The electrical component support bracket 100 further includes a component support member 110 (e.g., a metallic/non-metallic strap) configured to surround at least a portion of an electrical component 200. The component support member 110 may be cooperatively shaped (e.g., U-shaped) for the electrical component 200 to fit between the component support member 110 and the component support surface 106 when the component support member 110 is secured to the component support surface 106. In some embodiments, the component support member 110 also includes an opening 112 configured for a cooperatively shaped projection 202 of the electrical component 200 to extend through the opening 112 to stabilize the electrical component 200 when the electrical component 200 is held against the component support surface 106 by the component support member 110. In some embodiments, such as those illustrated in FIGS. 8A through 8E, the component support member 110 includes one or more elongated openings 115 and/or 119 (e.g., slots) extending along one or more respective side portions of the component support member 110. The one or more elongated openings 115 and/or 119 can be configured to slide over the projection 202 and/or any other retention feature on the electrical component 200 so that the component support member 110 can be installed by simply pressing the component support member 110 down on top of the electrical component 200, rather than having to manipulate (e.g., turn/twist) the electrical component 200 to make it mate with the component support member 110. The component support member 110 may include any number of retention features (e.g., opening 112, 115, and/or 119) that mate with cooperatively shaped features (e.g., projection 202) on the electrical component 200 to secure it in place. Retention features on the electrical component 200 may include, but are not limited to, projections/protrusions in the form of rails, tangs, ribs, lugs, and/or other clipping features. When the electrical component 200 is secured by the electrical component support bracket 100, the component support member 110 is configured to hold the electrical component 200 in an orientation that does not encumber any wires/cables 204 extending from the electrical component 200.

In embodiments, the component support member 110 includes a first tab 118 and a second tab 114 disposed at opposite ends of the component support member 110. The first tab 118 and the second tab 114 are configured to be coupled to the component support surface 110 so that the electrical component 200 is held against the component support surface 106 by the component support member 110. There are several methods by which the first tab 118 and the second tab 114 may be secured to the component support surface 106.

Figure 3:
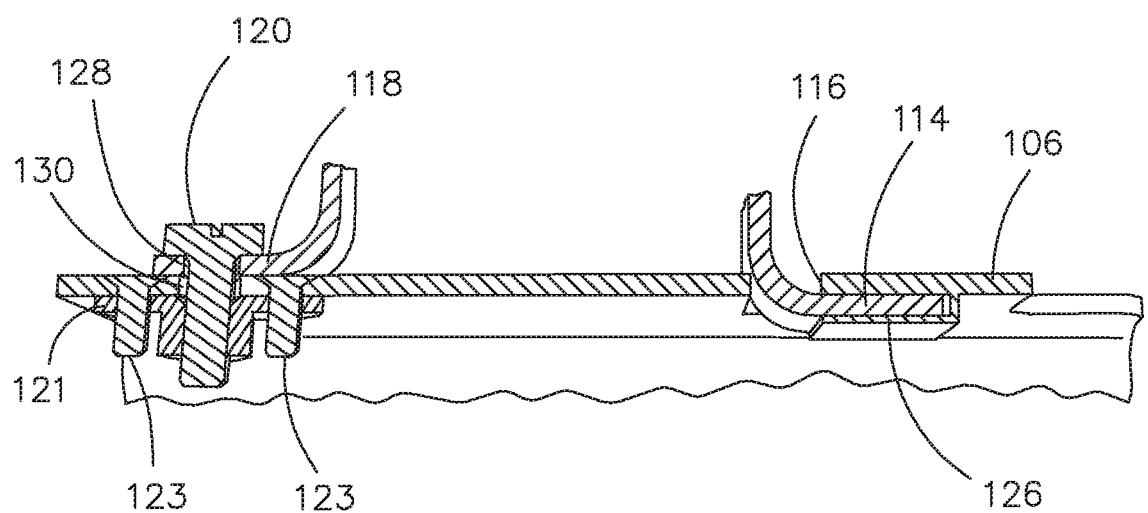
FIG. 3 is a partial cross-sectional view of an electrical component support bracket, in accordance with an example embodiment of this disclosure.
Figure 4:
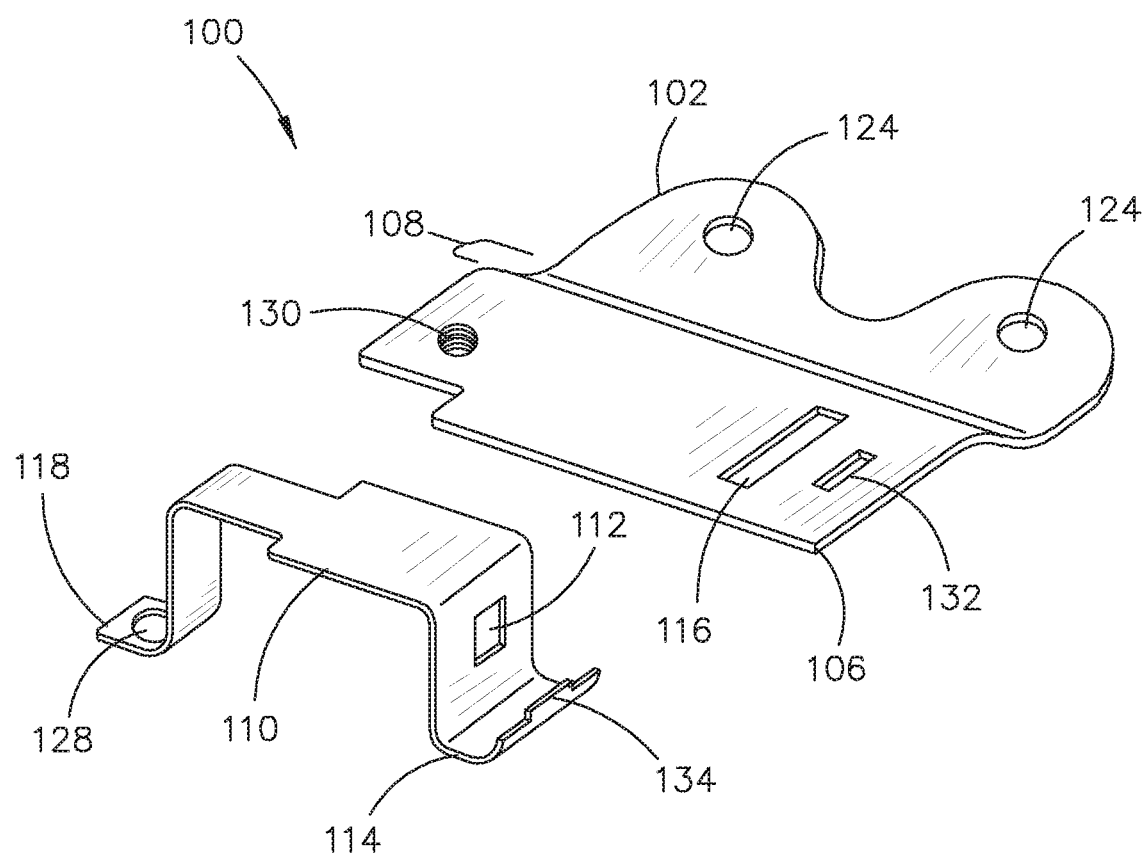
FIG. 4 is a perspective view of a base structure and a component support member of an electrical component support bracket, in accordance with an example embodiment of this disclosure.

In some embodiments, a fastener/fixing 120 (e.g., screw, bolt, or the like) is configured to secure the first tab 118 to the component support surface 106. For example, as shown in FIG. 3, the first tab 118 may include a respective opening 128 (e.g., hole/slot) for the fastener/fixing 120 to extend through in order to secure the first tab 118 to the component support surface 106. In some embodiments, the fastener/fixing 120 is configured to mate with a cooperatively threaded base 121 (e.g., rivet nut, floating rivet nut, any other type of nut, or the like) above, below, or at least partially embedded within the component support surface 106. The fastener/fixing 120 may be configured to extend through the respective opening 128 of the first tab 118 and a threaded opening 130 (e.g., a threaded hole) in the base 121 in order to secure the first tab 118 to the component support surface 106. The base 121 may be held in place by one or more fasteners/fixings 123 securing it beneath the component support surface 106. In some embodiments, such as those illustrated in FIGS. 8A through 8E, the base 121 (e.g., rivet nut) is angled to produce a smaller size bracket (e.g., having less width than would be required if the base 121 were not angled, for example, as shown in FIGS. 2 and 3.

The second tab 114 may be secured to the component support surface 106 by a clip connection. For example, the second tab 114 can be configured to extend into an opening 116 (e.g., slot) in the component support surface 106. In an embodiment illustrated in FIGS. 2 and 3, the second tab 114 is further configured to extend into a cavity/socket 126 underneath the component support surface 106 so that the second tab 114 is clipped into a secured position. In another embodiment illustrated in FIG. 4, the second tab 114 is to extend into an opening 116 (e.g., slot) in the component support surface 106, and the second tab 114 includes an upwardly oriented projection/protrusion 134 configured to at least partially extend into a second opening 132 (e.g., slot) in the component support surface 106. This may be referred to as a double slot retaining mechanism.

Figure 7A:
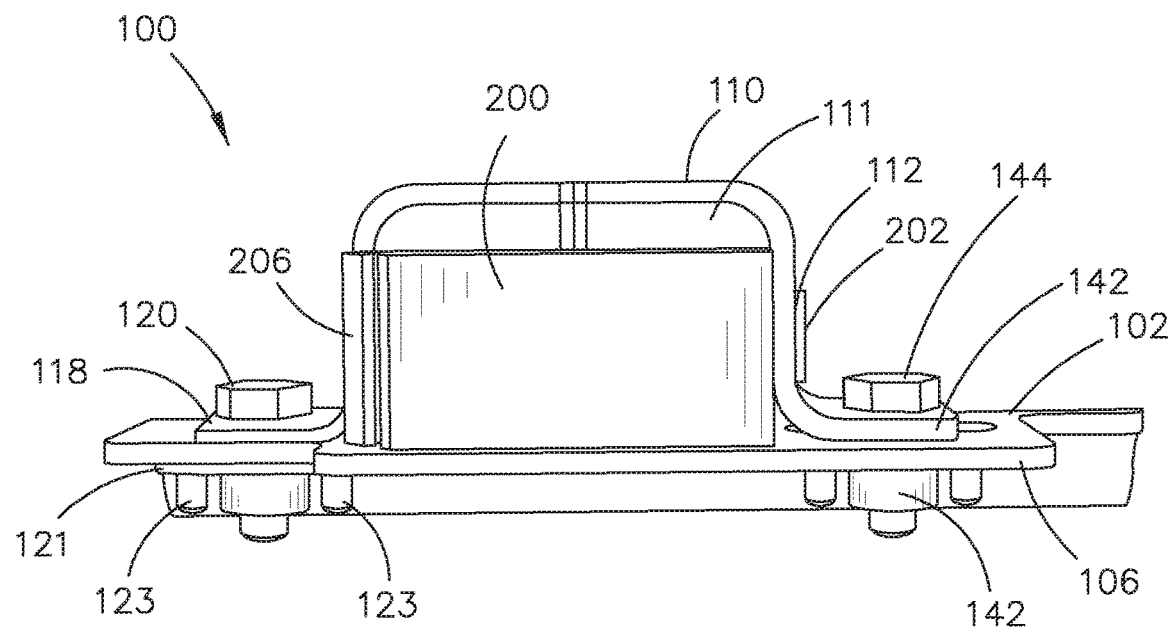
FIG. 7A is a side elevation view of an electrical component support bracket, in accordance with an example embodiment of this disclosure.
Figure 7B:
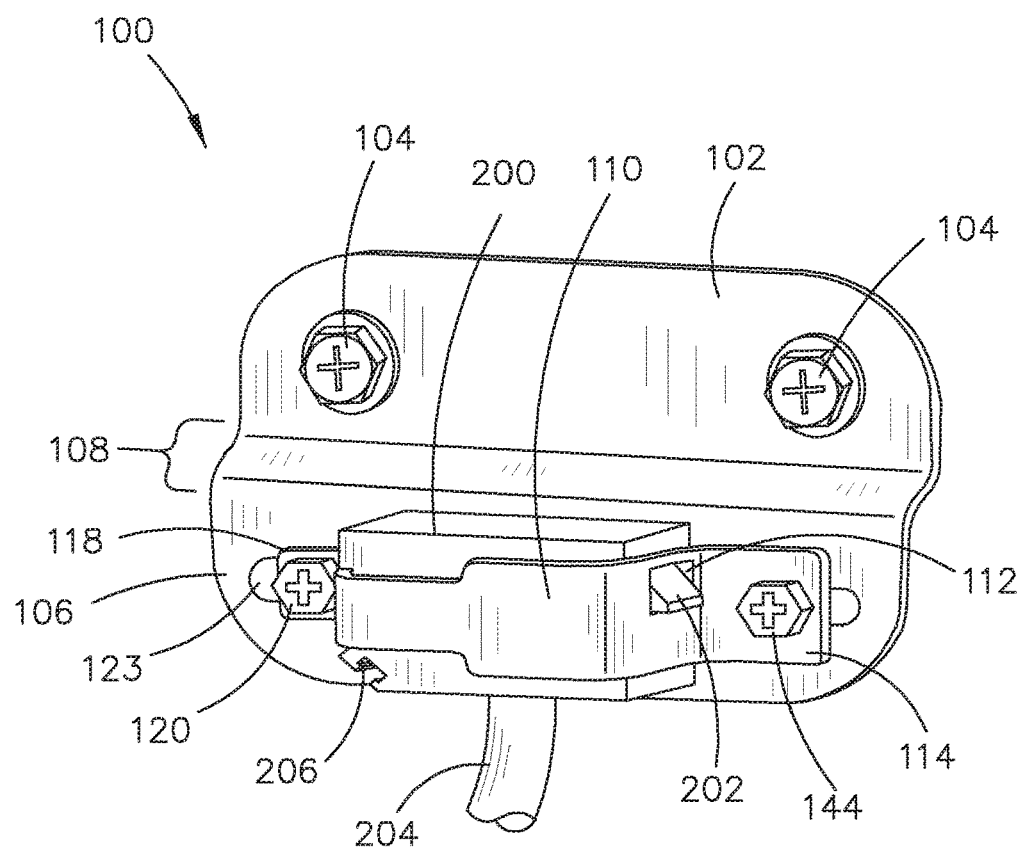
FIG. 7B is a perspective front view of an electrical component support bracket, in accordance with an example embodiment of this disclosure.
Figure 8A:
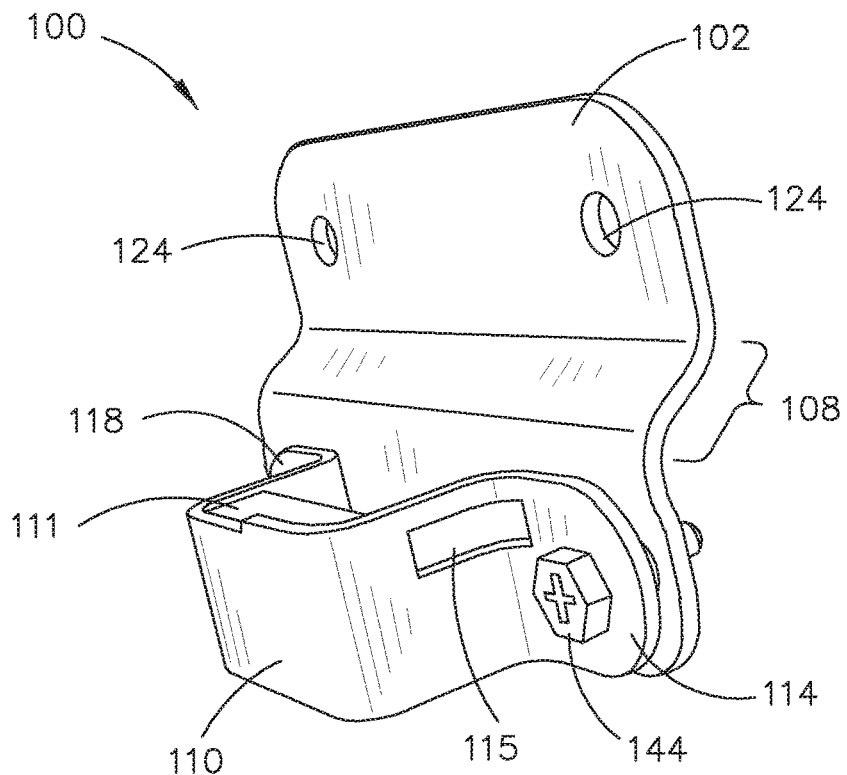
FIG. 8A is a perspective view of an electrical component support bracket, in accordance with an example embodiment of this disclosure.
Figure 8B:
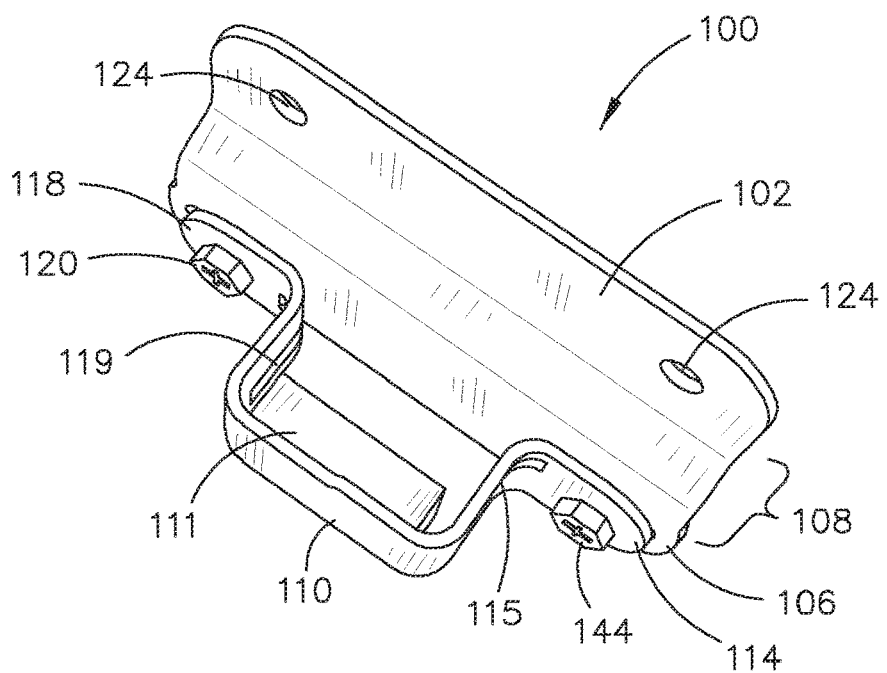
FIG. 8B is a perspective view of an electrical component support bracket, in accordance with an example embodiment of this disclosure.
Figure 8C:
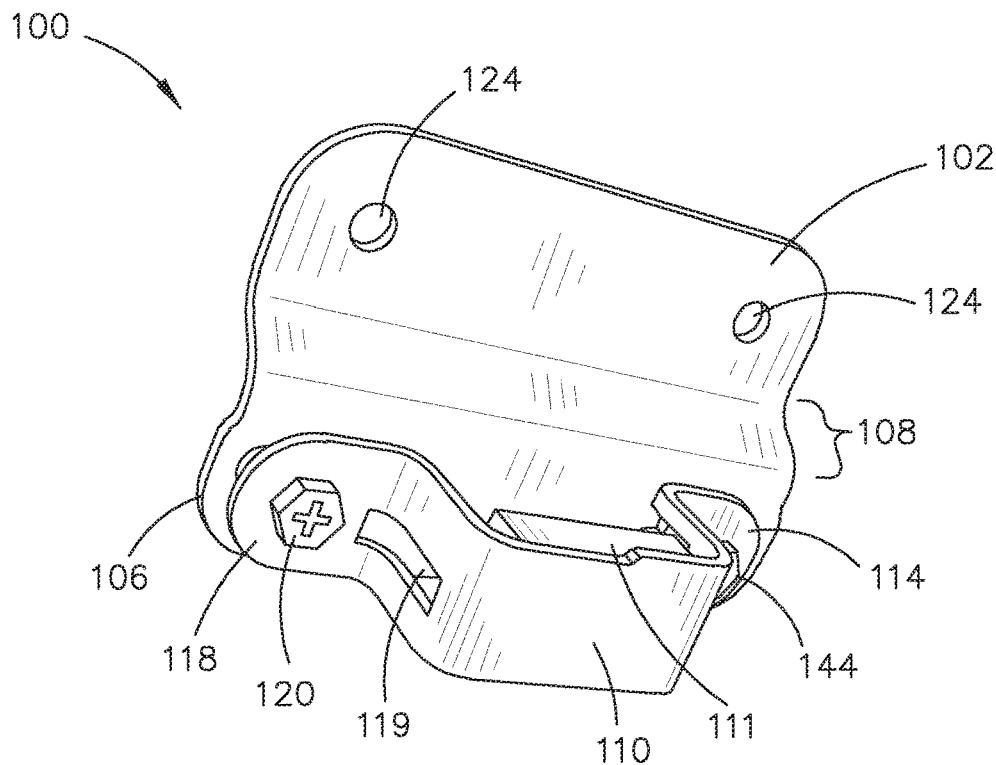
FIG. 8C is a perspective front view of an electrical component support bracket, in accordance with an example embodiment of this disclosure.
Figure 8D:
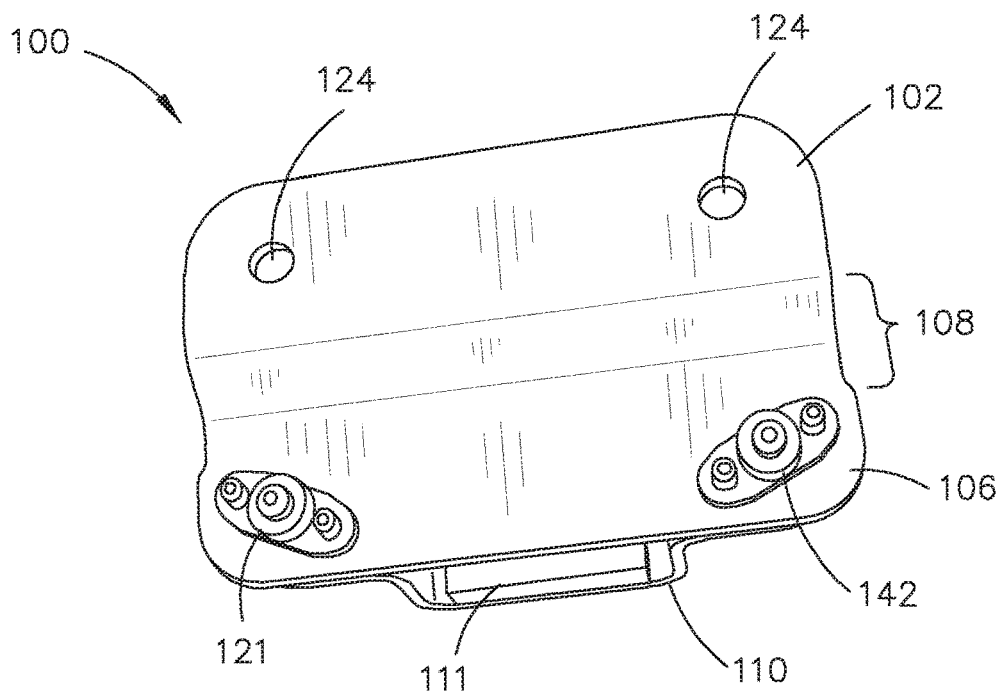
FIG. 8D is a perspective rear view of an electrical component support bracket, in accordance with an example embodiment of this disclosure.
Figure 8E:
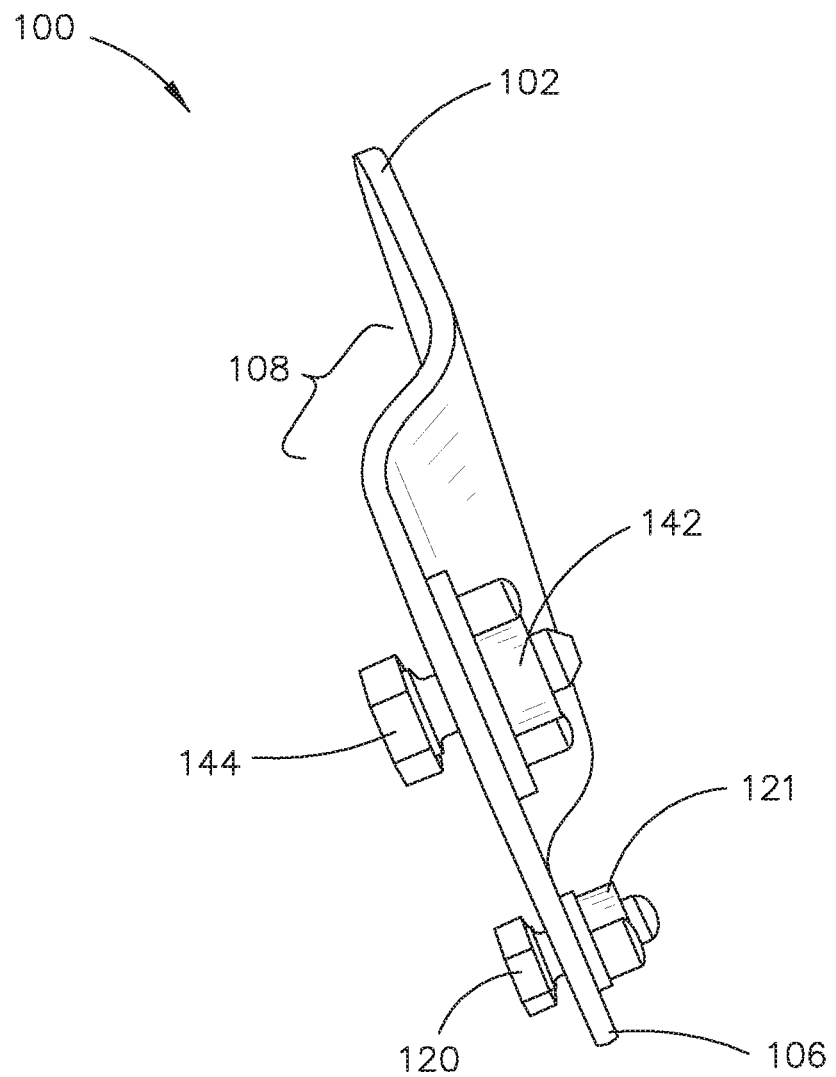
FIG. 8E is a perspective side view of a base structure of an electrical component support bracket, in accordance with an example embodiment of this disclosure.

In some embodiments, such as those illustrated in FIGS. 7A and 7B or in FIGS. 8A through 8E, another fastener/fixing 144 (e.g., screw, bolt, or the like) is configured to secure the second tab 114 to the component support surface 106, rather than using a clip mechanism as described above with reference to FIGS. 2 through 4. For example, the second tab 114 and the component support surface 106 may include respective openings (e.g., holes/slots) for the fastener/fixing 144 to extend through in order to secure the second tab 114 to the component support surface 106. In some embodiments, the fastener/fixing 144 is configured to mate with a cooperatively threaded base 142 or nut underneath the component support surface 106. The base 142 may be held in place by one or more fasteners/fixings securing it beneath the component support surface 106. In some embodiments, such as those illustrated in FIGS. 8A through 8E, the bases 121 and 142 (e.g., rivet nuts) are angled to produce a smaller size bracket (e.g., having less width than would be required if the bases 121 and 142 were not angled, for example, as shown in FIG. 7A.

Figure 5:
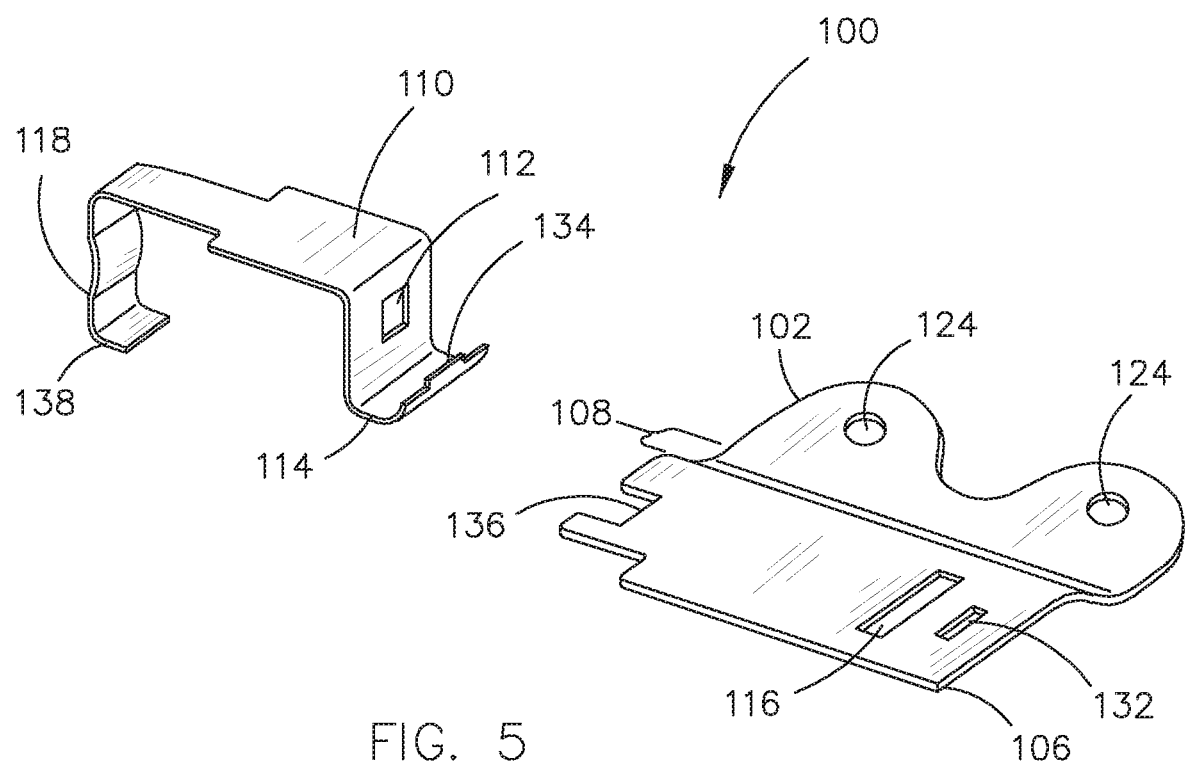
FIG. 5 is a perspective view of a base structure and a component support member of an electrical component support bracket, in accordance with an example embodiment of this disclosure.
Figure 6:
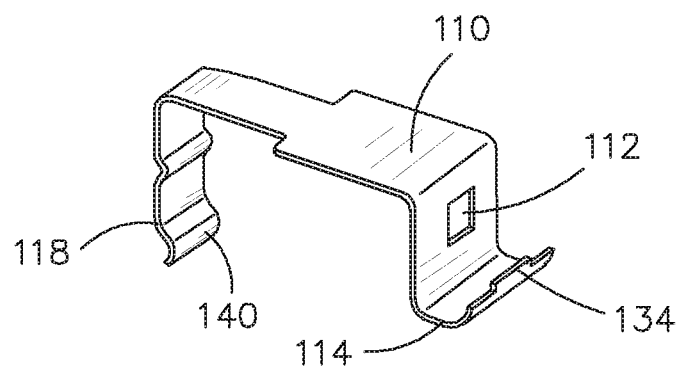
FIG. 6 is a perspective view of a component support member of an electrical component support bracket, in accordance with an example embodiment of this disclosure.

FIGS. 5 and 6 illustrate alternative embodiments of the electrical component support bracket 100, where the first tab 118 is configured to be secured to the component support surface 106 by a clip mechanism, rather than the fastener/fixing 120 described above. For example, the first tab 118 may include a projection/protrusion (e.g., bent tip 138 or distally formed bump 140) configured to fit into an indentation 136 formed in the component support surface 106 to secure the first tab 118 to the component support surface 106. In some embodiments, the tension caused by clipping the first tab 118 and the second tab 114 into respective retaining features (e.g., indentation 136 and slot 116) of the component support surface 106 serves to hold both tabs 118 and 114 in place and secure the component support member 110 to the component support surface 106. In other embodiments, such as those described above, tension for securing the component support member 110 is caused by fasteners/fixings (e.g., fasteners/fixings 120 and 144) for both tabs 118 and 114, or by a combination of a fastener/fixing (e.g., fastener/fixing 120) for the first tab 118 and a clip mechanism for the second tab 114. In other embodiments (not shown), the first tab 118 may be secured by a clip mechanism (e.g., as shown in FIG. 5 or FIG. 6), and the second tab 114 may be secured by a fastener/fixing (e.g., by fastener/fixing 144, as shown in FIGS. 7A and 7B or in FIGS. 8A through 8E).

Figure 9:
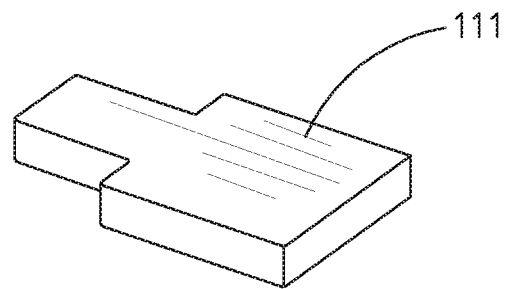
FIG. 9 is a perspective view of a deformable filler for a component support member of an electrical component support bracket, in accordance with an example embodiment of this disclosure.

FIG. 9 illustrates an example embodiment of a deformable filler 111 that may be employed to keep the electrical component 200 held firmly in position between the component support member 110 and the component support surface 106. For example, as shown in FIGS. 1 and 7A, the deformable filler 111 may be disposed between the component support member 110 and the electrical component 200 to keep the electrical component 200 under tension and prevent movement (e.g., rattles, wear, etc.) caused by operation vibration. In the embodiment illustrated in FIG. 9, the deformable filler 111 is a foam or sponge cutout/block that may be adhered to a portion of the of the component support member 110 that is configured to press against the electrical component 200. In other embodiments, the deformable filler 111 may be a metallic/non-metallic spring (e.g., like the deformable filler 151 illustrated in FIG. 12A). Any other deformable structure or material may be used, such as rubber, fabric, or the like. The deformable filler 111 can additionally or alternatively include a protrusion formed by the portion of the component support member 110 that is configured to press against the electrical component 200.

Figure 10:
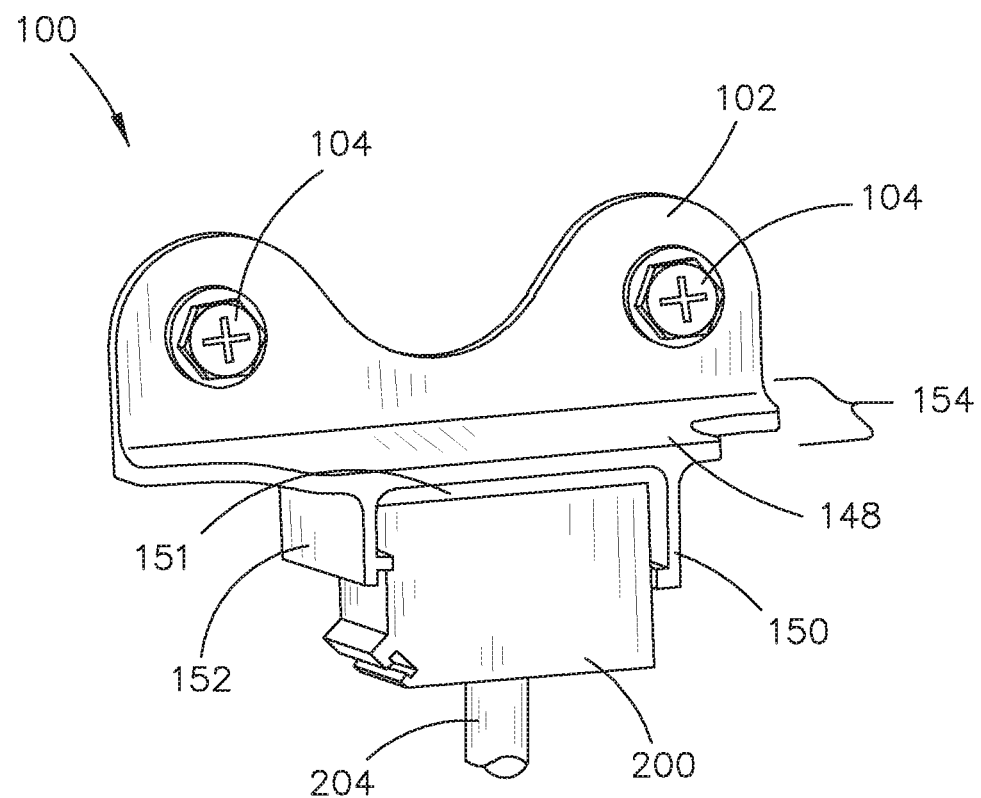
FIG. 10 is a perspective front view of an electrical component support bracket, in accordance with an example embodiment of this disclosure.
Figure 13:
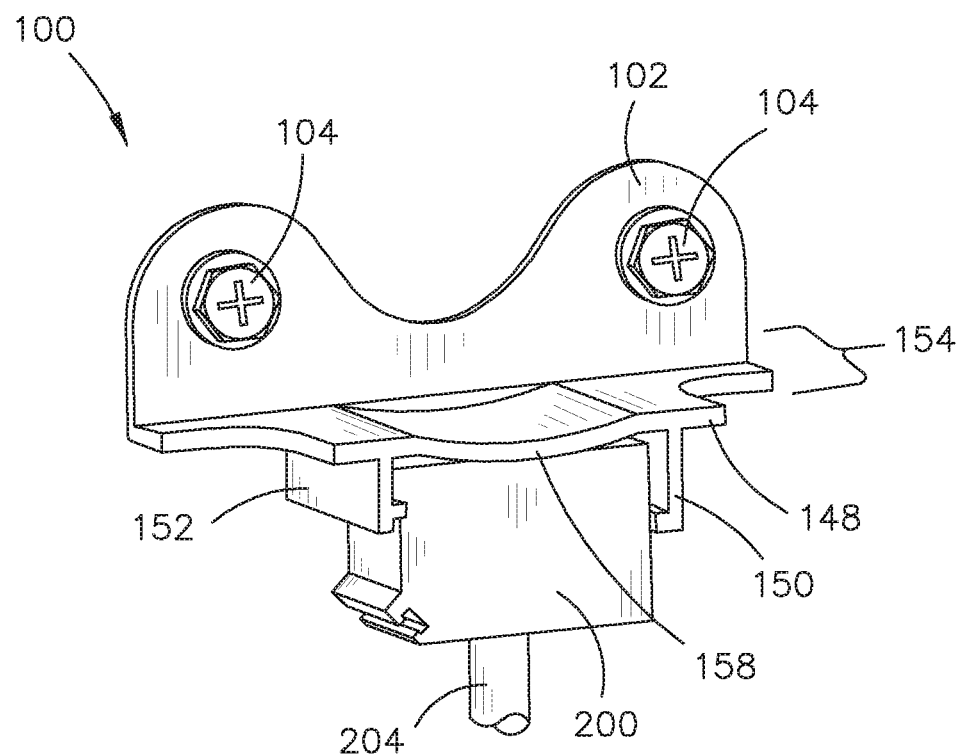
FIG. 13 is a perspective front view of an electrical component support bracket, in accordance with an example embodiment of this disclosure.
Figure 14:
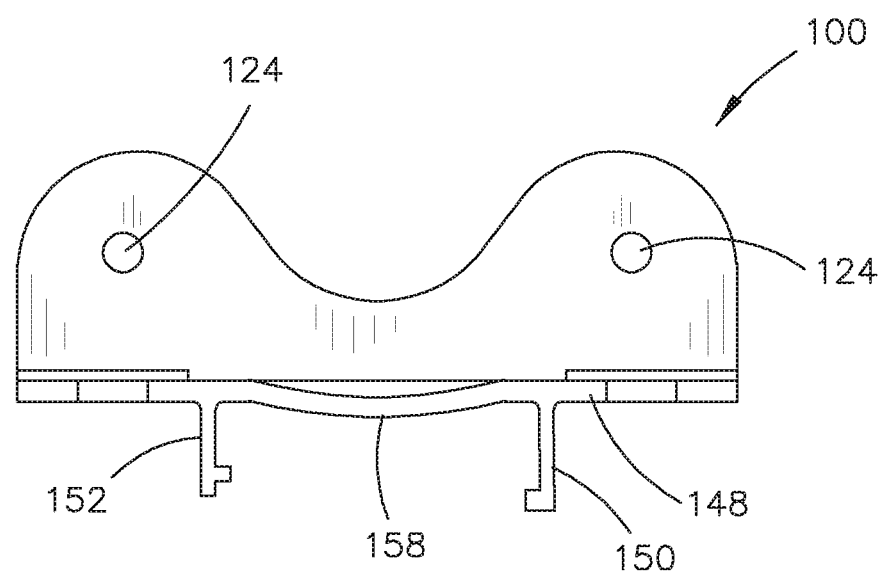
FIG. 14 is a front view of an electrical component support bracket, in accordance with an example embodiment of this disclosure.
Figure 15:
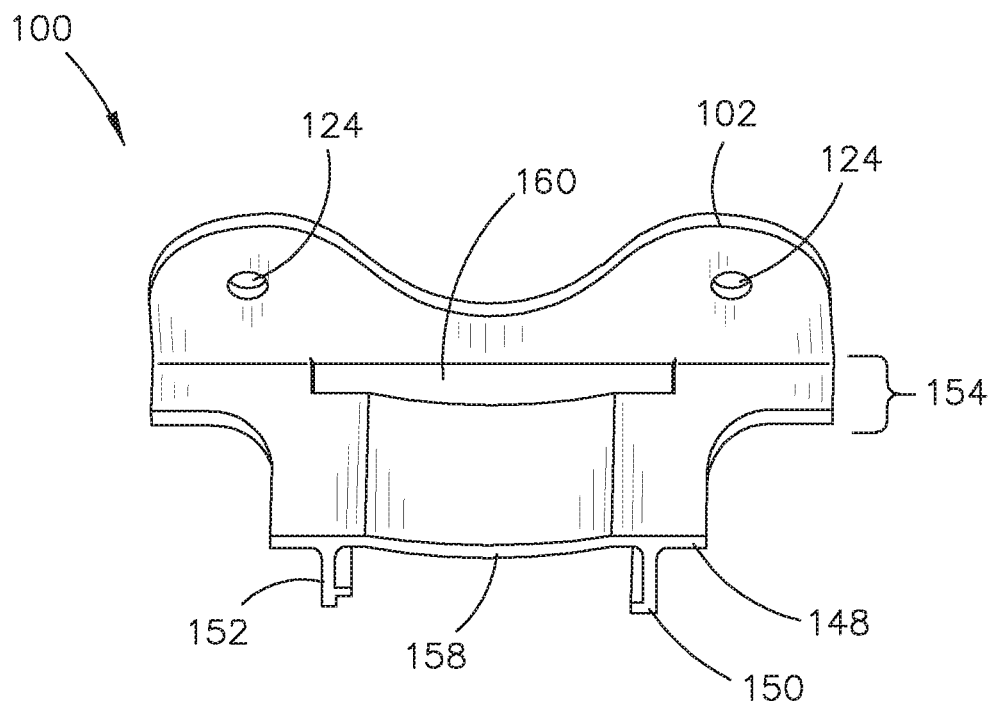
FIG. 15 is a perspective front view of an electrical component support bracket, in accordance with an example embodiment of this disclosure.

Alternative embodiments of the electrical support bracket 100 are illustrated in FIGS. 10 through 18. In these embodiments, the base structure or backplate includes a component support member 148 that extends from the base member 102, with an angled transition 154 between the base member 102 and the component support member 148. For example, the base member 102 and the component support member 154 may be portions of a common structure manufactured by metallic pressing or non-metallic injection molding, or alternatively by metallic/non-metallic casting. As shown in FIG. 10, the angled transition 154 or step between the base member 102 and the component support member 148 allows the component support member 148 to suspend an electrical component 200 held by the component support member 148. For example, the angled transition 154 may be a 90 degree or substantially 90 degree (e.g., 80 to 100 degree) transition so that the component support member 148 extends perpendicularly or substantially perpendicularly from the base member 102.

The component support member 148 is configured to surround at least a portion of an electrical component 200. For example, the component support member 148 may be cooperatively shaped (e.g., U-shaped) for at least a portion of the electrical component 200 to mate with the component support member 148. In embodiments, the component support member 148 includes a first vertical support leg 150 and a second vertical support leg 152 extending from opposite ends of the component support member 148 so that the electrical component 200 can be held between the first vertical support leg 150 and the second vertical support leg 152. The component support member 148 or portions thereof (e.g., vertical support legs 150 and 152) may include any number of retention features (e.g., projections) that interface/mate with cooperatively shaped features (e.g., projections/indentations) on the electrical component 200 to secure it in place. Retention features on the electrical component 200 may include, but are not limited to, projections/protrusions in the form of rails, tangs, indentations, and/or other clipping features. In some embodiments, such as the embodiment illustrated in FIG. 11, the component support member 148 or a portion thereof (e.g., vertical support leg 150) also includes an opening 156 (e.g., hole/slot) configured for a cooperatively shaped projection 202 of the electrical component 200 to extend through the opening 156 to stabilize the electrical component 200 when the electrical component 200 is held by and suspended from the component support member 148.

FIGS. 12A and 12B illustrate example embodiments of a deformable filler 151 that may be employed to keep the electrical component 200 held firmly in position when the electrical component 200 is secured by the component support member 148. For example, as shown in FIG. 10, the deformable filler 151 may be disposed between the component support member 148 and the electrical component 200 to keep the electrical component 200 under tension and prevent movement (e.g., rattles, wear, etc.) caused by operation vibration. In an embodiment illustrated in FIG. 12A, the deformable filler 151 is a metallic/non-metallic spring. In another embodiment illustrated in FIG. 12B, the deformable filler 151 is a foam or sponge cutout/block that may be adhered to a portion of the of the component support member 148 that is configured to press against the electrical component 200. Any other deformable structure or material may be used, such as rubber, fabric, or the like.

As shown in FIGS. 13 through 18, the deformable filler 151 can additionally or alternatively include a protrusion 158 formed by the portion of the component support member 110 that is configured to press against the electrical component 200. In some embodiments, such as the embodiment illustrated in FIG. 15, the component support member 148 may include a slot 160 formed along a length of the protrusion 158 to improve flexibility of protrusion 158 (i.e., the portion of the component support member 110 that is configured to press against the electrical component 200). Improved flexibility can make installation of the electrical component 200 easier, for example, by reducing the load placed on the electrical component 200 by the protrusion 158 during installation. Material reduction for the slot 160 can also help reduce weight of the overall structure.

Figure 16:
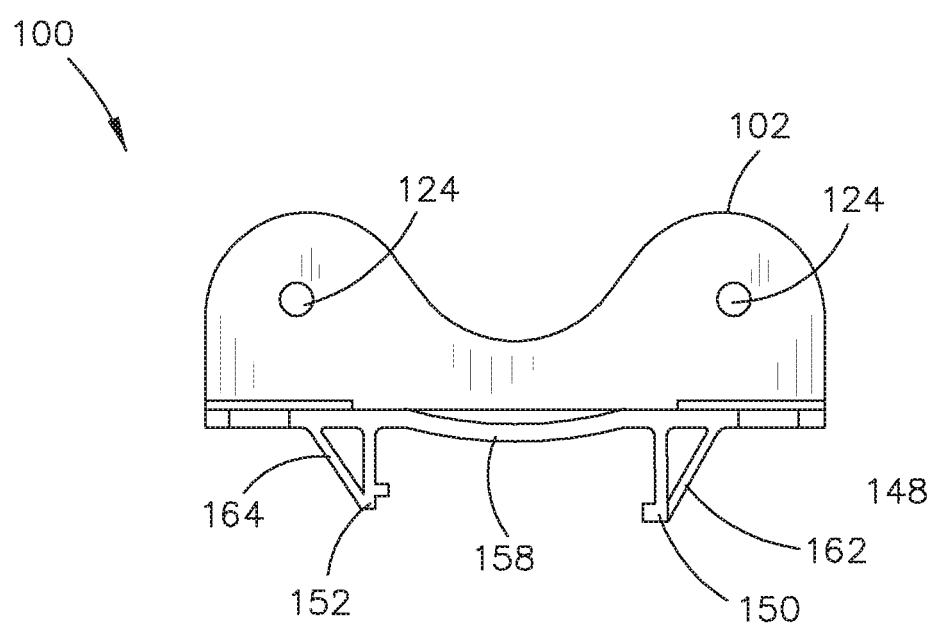
FIG. 16 is a front view of an electrical component support bracket, in accordance with an example embodiment of this disclosure.
Figure 17:
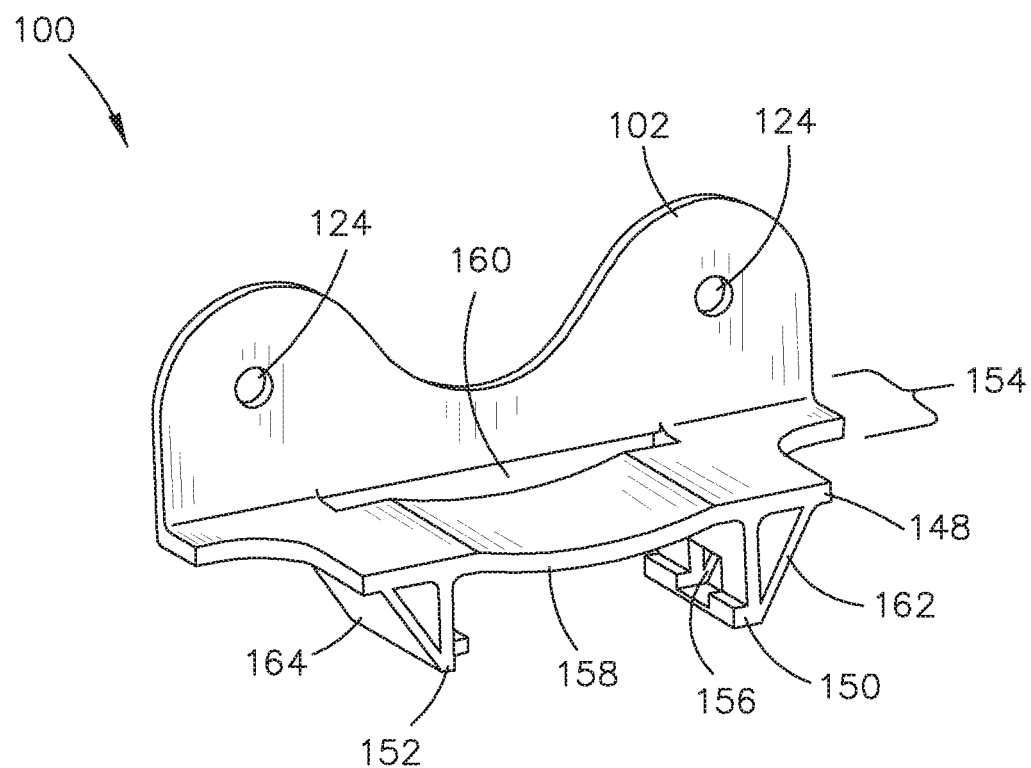
FIG. 17 is a perspective front view of an electrical component support bracket, in accordance with an example embodiment of this disclosure.

In some embodiments, such the embodiments illustrated in FIGS. 16 and 17, the component support member 148 further includes a first stiffener 162 and a second stiffener 164 configured to reinforce the first vertical support leg 150 and the second vertical support leg 152, respectively. For example, the stiffeners 162 and 164 may include strengthening/bracing webs, or the like, configured to stiffen the vertical support legs 150 and 152 that hold the electrical component 200 when the electrical component 200 is secured by the component support member 148, in order to prevent lateral movement of the electrical component 200 or vertical support legs 150 and 152 if distorted.

Figure 18:
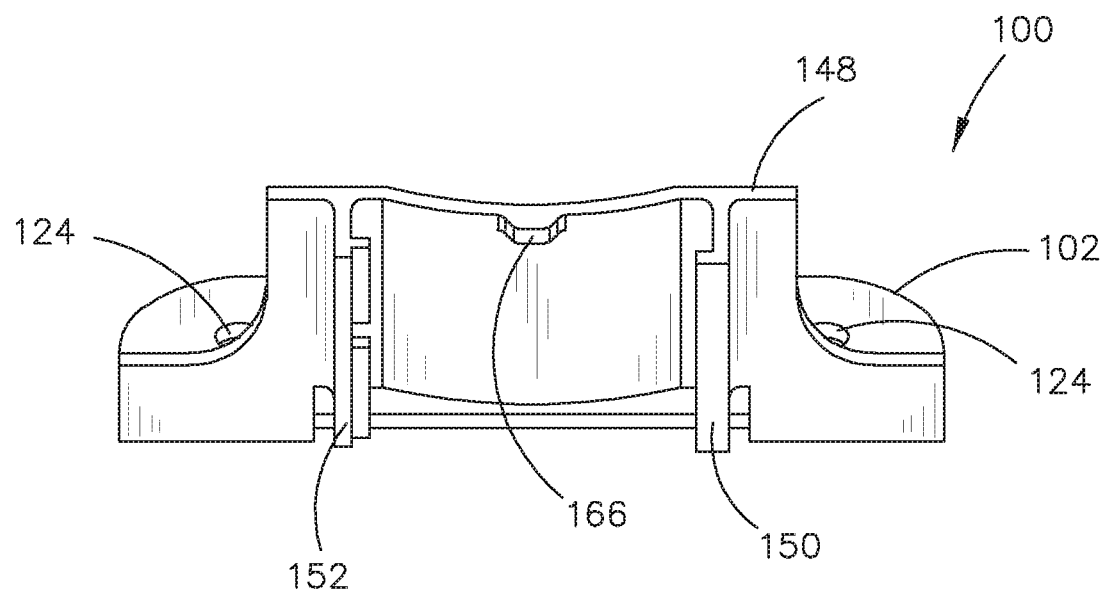
FIG. 18 is a bottom view of an electrical component support bracket, in accordance with an example embodiment of this disclosure.

As shown in FIG. 18, the component support member 148 may further include a retaining tab 166 extending from a portion of the component support member 148 that is between the first vertical support leg 150 and the second vertical support leg 152. For example, the retaining tab 166 may extend from an edge of the protrusion 158 and/or portion of the component support member 148 that is configured to press against the electrical component 200 when the electrical component 200 is secured/suspended by the component support member 148. The retaining tab 166 can be configured to stabilize the electrical component 200 when the electrical component 200 is held between the first vertical support leg 150 and the second vertical support leg 152 (i.e., when the electrical component 200 is secured/suspended by the component support member 148). The retaining tab 166 may prevent the electrical component 200 from going out of skew (e.g., by rotating) after installation and/or may prevent lateral movement of the electrical component 200 that could result in the electrical component 200 detaching from the component support member 148.

Advantages of the electrical component support bracket 100 embodiments described herein may include, but are not limited to: ability to use low cost pressed metal or plastic injection molded components instead of cast/machined components; simplified spring design or elimination (for some versions); electrically non-conductive when in plastic form; reduced weight; reduced part count (for some versions); and components are easily replaceable.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. An electrical component support bracket, comprising:
a base member including at least two attachment points for fastening the base member to a mounting surface, wherein the base member includes an indentation between the at least two attachment points;
a component support surface extending from the base member with an angled transition between the base member and the component support surface such that the component support surface is distant from the mounting surface and substantially parallel to the base member when the base member is fastened to the mounting surface; and
a component support member configured to surround at least a portion of an electrical component, the component support member including a first tab and a second tab disposed at opposite ends of the component support member, wherein the first tab and the second tab are configured to be coupled to the component support surface so that the electrical component is held against the component support surface by the component support member.

2. The electrical component support bracket of claim 1, further comprising a fastener configured to extend through a respective opening in the first tab to secure the first tab to the component support surface.

3. The electrical component support bracket of claim 2, wherein the second tab is configured to extend into an opening in the component support surface and is further configured to extend into a cavity underneath the component support surface.

4. The electrical component support bracket of claim 2, wherein the second tab is configured to extend into an opening in the component support surface, and wherein the second tab includes an upwardly oriented projection configured to at least partially extend into a second opening in the component support surface.

5. The electrical component support bracket of claim 2, further comprising a second fastener configured to extend through a respective opening in the second tab to secure the second tab to the component support surface.

6. The electrical component support bracket of claim 1, wherein the first tab includes a projection configured to fit into an indentation formed in the component support surface to secure the first tab to the component support surface.

7. The electrical component support bracket of claim 6, wherein the second tab is configured to extend into an opening in the component support surface and is further configured to extend into a cavity underneath the component support surface.

8. The electrical component support bracket of claim 6, wherein the second tab is configured to extend into an opening in the component support surface, and wherein the second tab includes an upwardly oriented projection configured to at least partially extend into a second opening in the component support surface.

9. The electrical component support bracket of claim 1, wherein the component support member includes an opening configured for a cooperatively shaped projection of the electrical component to extend through the opening to stabilize the electrical component when the electrical component is held against the component support surface by the component support member.

10. The electrical component support bracket of claim 1, further comprising a deformable filler disposed between the component support member and the electrical component.

11. The electrical component support bracket of claim 10, wherein the deformable filler comprises at least one of a foam, a sponge, or a spring.

* * * * *